(12) United States Patent
Johnson et al.

(10) Patent No.: US 7,606,282 B2
(45) Date of Patent: Oct. 20, 2009

(54) OPTIMIZING VCSEL MIRRORS FOR IMPROVING TEMPERATURE RESPONSE

(75) Inventors: Ralph H. Johnson, Murphy, TX (US); James Guenter, Garland, TX (US)

(73) Assignee: Finisar Corporation, Sunnyvale, CA (US)

( * ) Notice: Subject to any disclaimer, the term of this patent is extended or adjusted under 35 U.S.C. 154(b) by 110 days.

(21) Appl. No.: 11/963,315

(22) Filed: Dec. 21, 2007

(65) Prior Publication Data

US 2009/0161714 A1    Jun. 25, 2009

(51) Int. Cl.
*H01S 5/00*    (2006.01)

(52) U.S. Cl. .............. 372/50.124; 372/39.01

(58) Field of Classification Search .............. 372/44.01, 372/46.015, 46.01, 49.01, 50.124; 438/31
See application file for complete search history.

(56) References Cited

U.S. PATENT DOCUMENTS

| | | | |
|---|---|---|---|
| 5,224,113 A * | 6/1993 | Tsang | ............ 372/45.01 |
| 5,497,381 A | 3/1996 | O'Donoghue et al. | |
| 5,497,389 A * | 3/1996 | Kasukawa et al. | ....... 372/49.01 |
| 6,341,138 B1 | 1/2002 | Peters et al. | |
| 6,556,607 B1 * | 4/2003 | Jewell | ............ 372/49.01 |
| 6,980,579 B2 * | 12/2005 | Jewell | ............ 372/96 |
| 7,103,081 B2 | 9/2006 | Nomaguchi | |
| 7,312,581 B2 | 12/2007 | Roach | |

\* cited by examiner

*Primary Examiner*—Minsun Harvey
*Assistant Examiner*—Tuan N. Nguyen
(74) *Attorney, Agent, or Firm*—Workman Nydegger

(57) ABSTRACT

Improved slope efficiency in a VCSEL can be accomplished by selecting particular mirror layer compositions and/or mirror layer configurations that minimize increased reflectivity in the top mirror and/or maximize increased reflectivity of the bottom mirror with increasing temperature. Improved reflectivity of the bottom mirror compared to the top mirror over a desired operating temperature range can be facilitated by (i) selecting mirror pairs for the bottom and/or top mirror that gives the bottom mirror pairs a greater increase in contrast ratio with increasing temperature compared to the top-mirror pairs, and/or (ii) including fewer mirror pairs in the bottom mirror than the number of mirror pairs that would give optimal reflectivity.

25 Claims, 11 Drawing Sheets

OPTIMIZING VCSEL MIRRORS FOR IMPROVING TEMPERATURE RESPONSE

BACKGROUND OF THE INVENTION

1. The Field of the Invention

The invention generally relates to lasers. More specifically, the invention relates to Vertical Cavity Surface Emitting Lasers (VCSELs).

2. Description of Related Art

Lasers are commonly used in many modern components. One use that has recently become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers output a high optical output representing binary highs and a lower power optical output representing binary lows. To obtain quick reaction time, the laser is constantly on, but varies from a high optical output to a lower optical output.

Optical networks have various advantages over other types of networks such as copper wire based networks. For example, many existing copper wire networks operate at near maximum possible data transmission rates and at near maximum possible distances for copper wire technology. On the other hand, many existing optical networks exceed, both in data transmission rate and distance, the maximums that are possible for copper wire networks. That is, optical networks are able to reliably transmit data at higher rates over further distances than is possible with copper wire networks.

One type of laser that is used in optical data transmission is a Vertical Cavity Surface Emitting Laser (VCSEL). As its name implies, a VCSEL has a laser cavity that is sandwiched between and defined by two mirror stacks. A VCSEL is typically constructed on a semiconductor wafer such as Gallium Arsenide (GaAs). The VCSEL includes a bottom mirror constructed on the semiconductor wafer. Typically, the bottom mirror includes a number of alternating high and low index of refraction layers. As light passes from a layer of one index of refraction to another, a portion of the light is reflected. By using a sufficient number of alternating layers, a high percentage of light can be reflected by the mirror.

An active region that includes a number of quantum wells is formed on the bottom mirror. The active region forms a PN junction sandwiched between the bottom mirror and a top mirror, which are of opposite conductivity type (e.g. a p-type mirror and an n-type mirror). Notably, the notion of top and bottom mirrors can be somewhat arbitrary. In some configurations, light could be extracted from the wafer side of the VCSEL, with the "top" mirror totally reflective—and thus opaque. However, for purposes of this invention, the "top" mirror refers to the mirror from which light is to be extracted, regardless of how it is disposed in the physical structure. Carriers in the form of holes and electrons are injected into the quantum wells when the PN junction is forward biased by an electrical current. At a sufficiently high bias current the injected minority carriers form a population inversion in the quantum wells that produces optical gain. Optical gain occurs when photons in the active region stimulate electrons to recombine with holes in the conduction band to the valance band which produces additional photons. When the optical gain exceeds the total loss in the two mirrors, laser oscillation occurs.

The active region may also include an oxide aperture formed using one or more oxide layers formed in the top and/or bottom mirrors near the active region. The oxide aperture serves both to form an optical cavity and to direct the bias current through the central region of the cavity that is formed. Alternatively, other means, such as ion implantation, epitaxial regrowth after patterning, or other lithographic patterning may be used to perform these functions.

A top mirror is formed on the active region. The top mirror is similar to the bottom mirror in that it generally comprises a number of layers that alternate between a high index of refraction and a lower index of refraction. Generally, the top mirror has fewer mirror periods of alternating high index and low index of refraction layers, to enhance light emission from the top of the VCSEL.

Illustratively, the laser functions when a current is passed through the PN junction to inject carriers into the active region. Recombination of the injected carriers from the conduction band to the valence band in the quantum wells results in photons that begin to travel in the laser cavity defined by the mirrors. The mirrors reflect the photons back and forth. When the bias current is sufficient to produce a population inversion between the quantum well states at the wavelength supported by the cavity, optical gain is produced in the quantum wells. When the optical gain is equal to the cavity loss, laser oscillation occurs and the laser is said to be at threshold bias and the VCSEL begins to 'lase' as the optically coherent photons are emitted from the top of the VCSEL.

The slope efficiency of a VCSEL can be affected by many variables. Slope efficiency describes the relationship between an incremental increase in emitted power per incremental increase in electrical current passed through the PN junction. For example, low reflection in the bottom mirror, low transmission of the top mirror, and absorption within the top and bottom mirrors can all degrade the slope efficiency of a VCSEL, as can other optical losses such as scattering from the aperture or other features. Throughout this document, descriptions of low and high transmission or reflection apply at a specific wavelength, generally the wavelength at which the VCSEL lases.

Ideally, the slope efficiency of a VCSEL would remain constant during any operating condition. However, for several reasons, VCSEL slope efficiency usually fluctuates as the operating temperature changes, and often decreases as the operating temperature increases. Variations in slope efficiency over temperature hinder a designer's ability to accurately predict the response of a VCSEL, thereby complicating the design process. Some of the fluctuation in slope efficiency can be attributed to details of the active region, but slope efficiency fluctuation also depends on the over-temperature changes in the materials that comprise the top and bottom mirror layers above and below the active region.

In general, for mirrors formed of semiconductor layers, and within the wavelength range where the mirror layers are substantially transparent to the lasing wavelength, the reflectance of the mirror layers increases as the temperature increases. Typically, the reflectance of the top mirror increases at a higher rate than the reflectance of the bottom mirror as temperature increases. Consequently, as temperatures increase, less power is emitted for a given current input, thereby decreasing slope efficiency.

Furthermore, as temperatures increase, the absorption of the mirrors may also increase, which also affects the VCSEL's slope efficiency. Where there are losses due to absorption within the mirrors, it is possible for the slope efficiency to decrease even if the bottom mirror reflectivity increases more than the top mirror reflectivity.

Further compounding the slope efficiency problems that may arise is the manner in which the bottom mirror is constructed. Common practice has been to use bottom mirror periods (i.e., alternating layers of high and low refractive index materials relative to one another) of the number that would provide the highest level of reflectance when operating at room temperature. By maximizing the reflectance at room temperature, a high slope efficiency is achieved at room temperature. By achieving close to 100% reflectance at room temperature, the bottom mirror reflectance is unable to increase significantly as temperature increases. However, in the top mirror, necessarily less reflective in efficient lasers, reflectance may increase as temperatures increase, thereby causing slope efficiency to suffer.

In addition to the reflectivity of a mirror changing with temperature, the wavelength at which maximum reflectivity and transmission occurs also varies with temperature. Some current VCSEL designs have attempted to minimize slope efficiency fluctuation over temperature by intentionally mismatching the wavelengths at which maximum reflectivity is achieved for the top and bottom mirrors. For example, the top mirror may be designed such that maximum reflectivity is achieved at room temperature, and the bottom mirror may be designed to operate at a wavelength slightly higher than the wavelength at which maximum reflectivity is achieved when operating at room temperature. As the ambient temperature increases, the wavelength at which maximum reflectivity is achieved also increases. The VCSEL emission wavelength is also increasing as the temperature increases. Therefore, the reflectivity of the bottom mirror decreases, and the reflectivity of the top mirror may increase. In this manner, the VCSEL is designed in an attempt to minimize maintain or increase slope efficiency as the ambient temperature increases.

The subject matter claimed herein is not limited to embodiments that solve any disadvantages or that operate only in environments such as those described above. Rather, this background is only provided to illustrate one example technology where some embodiments described herein may be practiced.

BRIEF SUMMARY OF THE INVENTION

The present invention relates to a VCSEL that has a relatively stable slope efficiency over a desired operating temperature. In one embodiment, the slope efficiency is made to be stable by providing a bottom mirror with mirror pairs that have a contrast ratio that increases with temperature at a greater rate than an increase in contrast ratio of the top mirror. The greater increase in contrast ratio with increasing temperature in the bottom mirror results in a higher increase in reflectance in the bottom mirror compared to the top mirror as temperature rises over a desired operating temperature.

Alternatively or in addition to properly selecting the materials of the bottom and/or top mirror for a desired changing contrast ratio, the stability in slope efficiency can be achieved by including fewer than an optimal number of mirror pairs in the bottom mirror. A bottom mirror with fewer mirror pairs than the number of mirror pairs that gives maximum possible reflectance will tend to have a greater increase in reflectivity with increasing temperature compared to a bottom mirror that is made to have a maximum possible reflectivity. A non-optimal number of mirror pairs in the bottom mirror is in direct contrast to many VCSELs which optimize the bottom mirror so as to achieve maximum gain across the operating temperature. By reducing the number of mirror pairs, the present invention, in one embodiment, can achieve a relatively more stable slope efficiency at the expense of a maximum possible gain.

In one embodiment, a VCSEL includes a bottom mirror above a substrate, the bottom mirror including a plurality of lower mirror pairs, each lower mirror pair including a first bottom-mirror layer and a second bottom-mirror layer. The first and second bottom-mirror layers have different indices of refraction and a contrast ratio that increases with increasing temperature over a desired operating temperature range. An active region is formed above the bottom mirror and includes a plurality of quantum wells. An upper mirror formed above the active region includes a plurality of upper mirror pairs. Each upper mirror pair includes a first upper-mirror layer and a second upper-mirror layer, the first and second upper-mirror layers having different indices of refraction. And, with increasing temperature over the desired operating temperature range, the contrast ratio of the first and second upper-mirror layers either (i) decreases or (ii) increases to a lesser extent than the contrast ratio of the first and second bottom-mirror layers, thereby reducing fluctuation of a slope efficiency of the VCSEL.

In one embodiment, the desired operating temperature is in a range from about 0.0° C. to about 70° C., more preferably from about −40° C. to about 85° C., and alternatively from about 0.0° C. to about 125° C.

Alternatively, or in addition to the foregoing, slope efficiency of the VCSEL can be improved by reducing the number of mirror periods in the bottom mirror to fewer than the number of mirror periods that gives the maximum possible reflectivity. In one embodiment, the mirror periods are selected such that the bottom mirror has a non-optimized reflectivity of less than 99.8%, more preferably less than about 99.7%, and most preferably less than about 99.6%. Surprisingly small reductions in bottom mirror optimization can have a significant impact on stabilization of slope efficiency. In one embodiment, the non-optimized bottom mirror includes at least 2 fewer mirror pairs than an optimal number of mirror pairs, more preferably 5 fewer mirror pairs, where the optimal number of mirror pairs is the fewest mirror pairs that gives a reflectivity that is within 0.1% of the maximum possible reflectivity. Alternatively the reduced number of mirror pairs can be a range. In one embodiment, bottom mirror has 2-6 fewer mirror pairs than an optimal number of mirror pairs.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

To address fluctuation in slope efficiency VCSELS, embodiments described herein are optimized in one or more areas. Improved slope efficiency in a VCSEL can be accomplished by selecting particular mirror layer compositions and/or mirror layer configurations that minimize increased reflectivity in the top mirror and/or maximize increased reflectivity of the bottom mirror with increasing temperature. Improved reflectivity of the bottom mirror compared to the top mirror over a desired operating temperature range can be facilitated by (i) selecting mirror pairs for the bottom and/or top mirror that gives the bottom mirror pairs a greater increase in contrast ratio with increasing temperature compared to the top-mirror pairs, and/or (ii) including fewer mirror pairs in the bottom mirror than the number of mirror pairs that would give optimal reflectivity.

Figure 1:
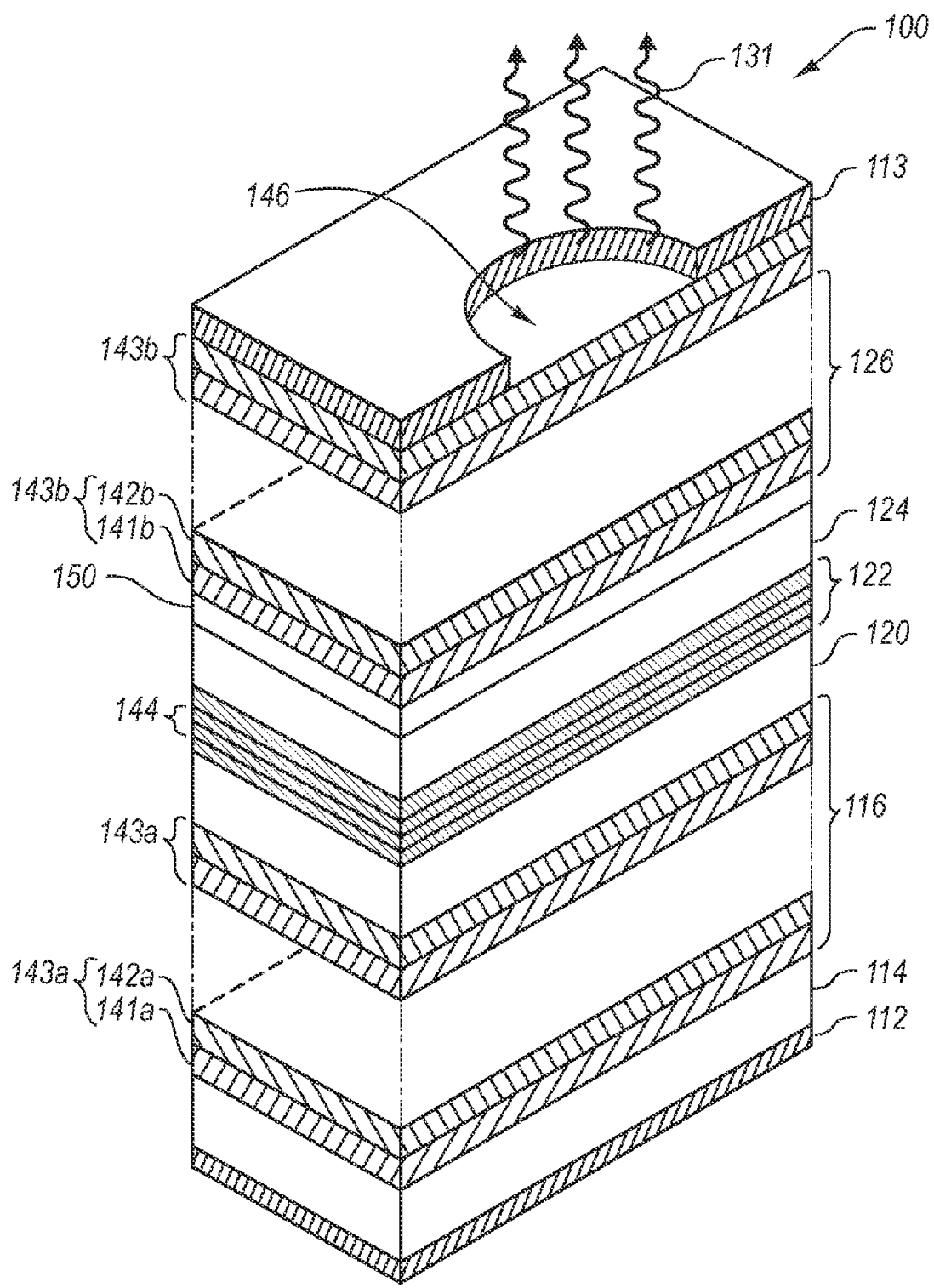
FIG. 1 illustrates one example of a VCSEL according to the present invention.

FIG. 1 shows a planar, current-guided, vertical cavity surface emitting laser (VCSEL) 100 having periodic layer pairs for top and bottom Bragg mirrors. In the illustrated VCSEL 100, a substrate 114 is disposed on a bottom contact 112 and is doped with a first type of impurities (i.e. p-type or n-type dopant). In this example, the substrate 114 may be a gallium arsenide (GaAs) substrate. In other embodiments, the substrate 114 may be other material such as other III-V semiconductor materials. A bottom mirror stack 116 is formed on substrate 114 and a bottom confining layer 120 may be formed on bottom stack 116. The bottom confining layer 120 and a top confining layer 124 sandwich an active region 122. An upper mirror stack 126 is formed on the top confining layer 124. A metal layer 113 forms a contact on a portion of mirror stack 126. The VCSEL 100 structure may go through various etching, deposition and oxide growth stages during formation.

Stacks 116 and 126 can be distributed Bragg reflector (DBR) stacks. Each DBR stack 116 and 126 includes alternating layers 141a, 142a, 141b and 142b of high and low refractive index materials. Each alternating layer pair is called a period 143a and 143b. The optical thickness of each alternating layer pair is typically equal to an integral number of half the wavelength of the laser to be constructed. For each material, the optical thickness is equal to the physical thickness times the material's refractive index. The top mirror 126 may include about twenty mirror periods where each period includes a high index of refraction layer and a low index of refraction layer.

In the example shown, the bottom mirror 116 may include alternating layers of aluminum arsenide (AlAs) and GaAs, or of their intermediate AlGaAs alloys, but can be made from other III-V semiconductor materials. Stacks 116 and 126 can be doped or undoped and the doping can be n-type or p-type depending on the particular VCSEL design. In conventional VCSEL designs, the bottom mirror 116 may include about 30 to 35 mirror periods.

The active region 122 includes quantum wells 144 for stimulating the emission of laser energy. In the embodiment shown, the active region 122 may be less than 1 micron. The central region of the quantum wells 144 may also be referred to as the optical gain region. This central region of the quantum wells 144 is the location where current through the active region and the presence of injected free carriers, holes and electrons, causes population inversion and optical gain. These electrons from the conduction band quantum well states combine with the holes in the valence band quantum well states (i.e. across the band gap) to cause the emission of photons 131. An aperture 146 may be provided for lateral definition of the laser optical cavity.

In one embodiment, an aperture may also be provided near a conduction layer region above the quantum wells 144 for directing bias current to the central region of the VCSEL active region 122.

Metal contact layers 112 and 113 can be ohmic contacts that allow appropriate electrical biasing of VCSEL 100. When VCSEL 100 is forward biased with a voltage on contact 113 different than the one on contact 112, active region 122 emits light 131 which passes through stack 126. Although the contact layers 112 and 113 in the example VCSEL 100 are located on the top and bottom surfaces of the VCSEL, in other embodiments, p-type and n-type intracavity contacts may be used.

While various layers of the epitaxial structure have been described as being formed on other layers, this does not require that the layers be formed directly on the other layers. Rather, other intervening layers may exist between a layer and the layer in which that layer is formed. Various portions of the present discussion may refer to several configurations of the VCSEL.

The laser functions when a current is passed through the active region 122, as described previously. The relationship between an incremental increase in emitted power per incremental increase in electrical current passed through the active region 122 is defined as "slope efficiency." The present invention provides mirror composition choices and mirror construction techniques that may be used for stabilizing slope efficiency change over a temperature range.

In general, at least one of the mirrors 116 and/or 126 in the VCSEL 100 may use epitaxially grown semiconductor layers. Because of constraints on stresses generated during the growth, the choice of materials for these semiconductor mirrors is typically limited to those with atomic lattice spacings similar to those of the active region 122. For purposes of the following description, it will be assumed the active region 122 is GaAs (with the potential admixture of up to 10% Al or In), which means that nearly lattice matched mirrors use intermediate compositions from the $Al_xGa_{1-x}As$ family, but it should be understood that many other families of semiconductors, including binary, ternary, quaternary, or even more complex materials, would have similar behaviors and similar constraints.

The top mirror 126 of the VCSEL 100 may also be formed of epitaxial semiconductor layers, of deposited dielectric layers, or a hybrid of both. The design principles disclosed herein are similar for any of these approaches. When the top mirror 126 is an AlGaAs semiconductor mirror, extensive use of GaAs or AlAs can be used to conduct heat away from the active region 122, including the quantum wells 144, so as to enhance reliability and to maximize peak power output. In general, binary compounds have much higher thermal conductivity than do their intermediate alloys. A phase matching layer 150 may be included below the top mirror 126. The phase matching layer 150 matches the phase to the top mirror 126.

Figure 2:
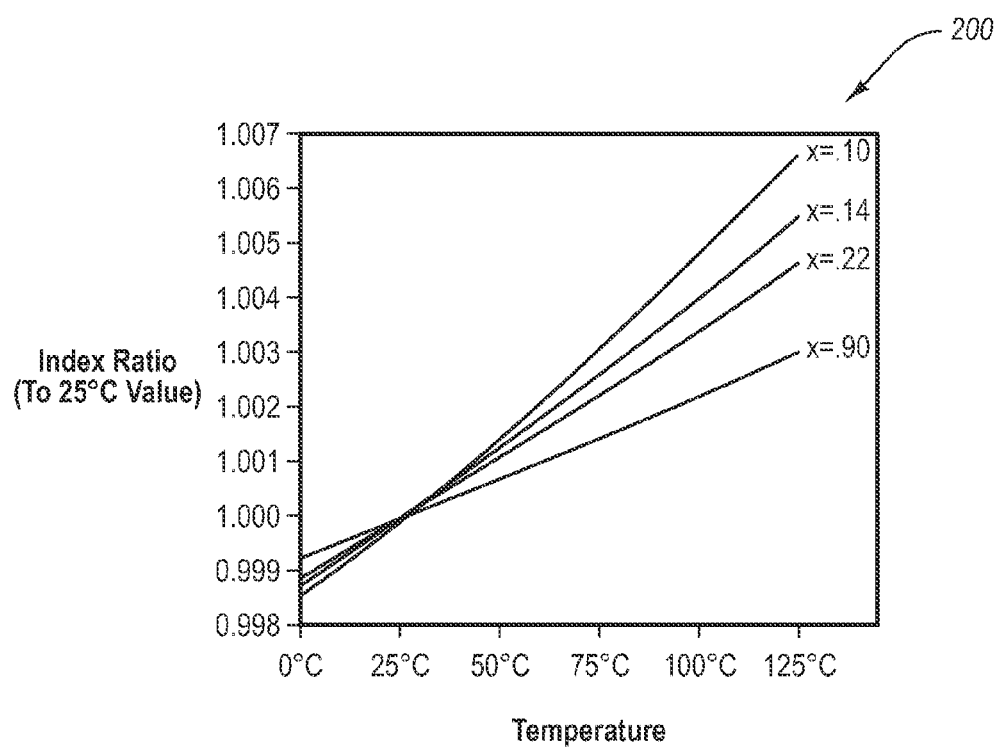
FIG. 2 illustrates an index ratio versus temperature plot of various compositions.

For mirrors formed of semiconductor layers, and in the wavelength range where the semiconductor layers are substantially transparent to the lasing wavelength, the refractive index increases as the temperature increases. This is true both for the high refractive index layer and the low refractive index layer within each period 143a and/or 143b within the DBR 116 and/or 126. The rate at which the refractive index of a given composition changes with temperature can be quantified by generating a ratio between the refractive index of the composition at a reference temperature (e.g., 25° C.) to the refractive index at a different temperature. The rate at which the ratio of refractive indices changes as temperature increases depends on the dispersion for each composition. By way of illustration, the refractive index ratios at 850 nm for several compositions are plotted in FIG. 2, where 'X' is the aluminum fraction in the alloy $Al_xGa_{1-x}As$, and where a low X value produces a high refractive index and a high X value produces a low refractive index. As plot 200 illustrates, as temperature increases, the refractive index ratio increases faster for compositions having low aluminum fraction than for compositions having high aluminum fraction. By selecting appropriate pairs of X-values for high and low index layers within a mirror period 143a and 143b, the amount that a composition's refractive index ratio departs from its baseline index at 25° C. can be controlled.

Figure 3:
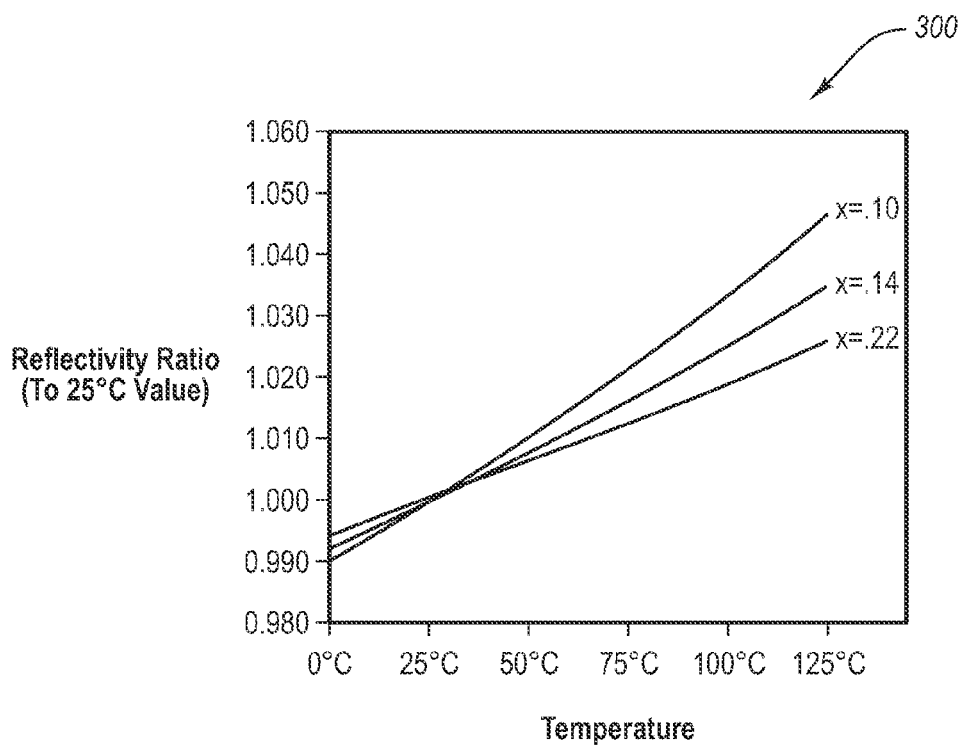
FIG. 3 illustrates a reflectivity ratio versus temperature plot of various compositions.

Reflectivity is a function of the ratio of the refractive indices of two adjacent compositional layers. In general, reflectivity increases as the difference between the refractive indices of two adjacent layers increases. While the total reflectivity of a DBR stack depends on the constructive effects of multiple reflections adding in phase, it is instructive to look at the reflectivity of a single interface between a low refractive index layer and a high refractive index layer, where low and high refractive index describes the relationship of the index layers relative to one another. Referring to FIG. 3, a plot 300 of reflectivity ratio at 850 nm versus temperature is illustrated for a variety of interfaces between a reference low refractive index layer having aluminum fraction of X=0.9 and a second high refractive index layer having aluminum fraction of X=0.10, 0.14, or 0.22. The reflectivity ratio is the ratio between the interfaces' reflectivity at the 25° C. reference temperature and the interfaces' reflectivity at another temperature along the temperature axis of plot 300. The reflectivity increases as the temperature increases, but it increases a different amount for each compositional interface. Each potential pair of low-X and high-X materials results in a different curve over temperature. As illustrated in the plot 300, as temperature increases, reflectivity increases faster for interfaces having a high index contrast (i.e., the difference in refractive indices for the two compositions) than for interfaces having a lower index contrast.

As described previously, the VCSEL 100 has both a top and a bottom mirror 126 and 116. In a conventional configuration where both mirrors 126 and 116 are semiconductor mirrors, the reflectivities of both mirrors will typically increase with increasing temperature, as described above. Given that the slope efficiency is measured from the power exiting from only the top mirror 126, the slope efficiency will increase if the reflectivity of the bottom mirror 116 increases more than the reflectivity of the top mirror 126, and will decrease if the reflectivity of the top mirror 126 increases more than the reflectivity of the bottom mirror 116. In general, the reflectance of the top mirror increases at a higher rate than the reflectance of the bottom mirror as temperature increases, resulting in a monotonically decreasing slope efficiency as temperature increases. Consequently, as temperatures increase, less power is emitted for a given current input. In certain configurations, where losses occur due to absorption within the mirrors 116 and 126, it is possible for the slope efficiency to decrease even if the bottom mirror 116 reflectivity increases more than the top mirror 126 reflectivity. In accordance with the present invention, if mirror absorption or active region 122 effects result in a negative coefficient of slope efficiency with temperature, proper choice of X values can partially or completely compensate that negative coefficient.

The choice of materials for the mirrors 116 and 126 is typically guided by the constraints on the available materials. For example, for semiconductor VCSEL mirrors, the electrical and thermal performance is typically best when the X values are nearest one or zero. Furthermore, the epitaxial growth tolerance is generally best when X is precisely zero or one. Finally, the susceptibility to degradation by fabrication processes can have a complex relationship to X values. In response to these constraints, and in ignorance of the principles of the current invention, general industry practice has been to choose high index layers 141 with X as small as will maintain transparency at the lasing wavelength, and to choose low index layers 142 with X as large as will allow subsequent processes, such as selective oxidation, to proceed. Accordingly, the mirrors 116 and 126 are typically designed to achieve optimal performance at room temperature (e.g. 25° C.). This has resulted in designs that do not have optimal slope efficiency over-temperature performance, due to the high level of fluctuation in reflectivity levels when reflectivity index contrast is high.

In accordance with one embodiment of the present invention, the compositions of the mirror layers 141 and 142 are selected such that the room temperature characteristics of the mirrors are not necessarily optimized. Instead, mirror layer 141 and 142 compositions are selected such that slope efficiency change over temperature is reduced. This may lead to using different compositions in the top and bottom mirrors 116 and 126, and to using compositions that may depart further from the binary endpoints than might otherwise be chosen.

For example, and in one embodiment, the compositions of the layers 141b and 142b of the top mirror 126 are selected such that a contrast ratio between the refractive indices of the first layer 141b and the second layer 142b decreases as the operating temperature increases within a predetermined temperature range. Because the contrast ratio decreases as operating temperatures increase, the reflectivity of the top mirror 126 decreases and the transmission of the top mirror increases as temperatures increase. The rate at which transmission increases with temperature can be selected so as to offset any losses that occur due to absorption and other factors as temperature increases. Consequently, slope efficiency fluctuation is reduced as operating temperature changes within the predetermined temperature range.

In another embodiment, a separate composition choice is made for the compositions of the layers 141a and 142a of the bottom mirror 116. The compositions of the layers 141a and 142a may be selected such that the reflectivity of the bottom mirror 116 increases at a higher rate than the increase in reflectivity of the top mirror 126 as the temperature increases. By selecting compositions for the bottom mirror layers 141a and 142a that cause the bottom mirror's reflectivity to increases at a higher rate than the reflectivity of the top mirror, the slope efficiency for the VCSEL 100 remains stable or increases as temperature increases.

Figure 4:
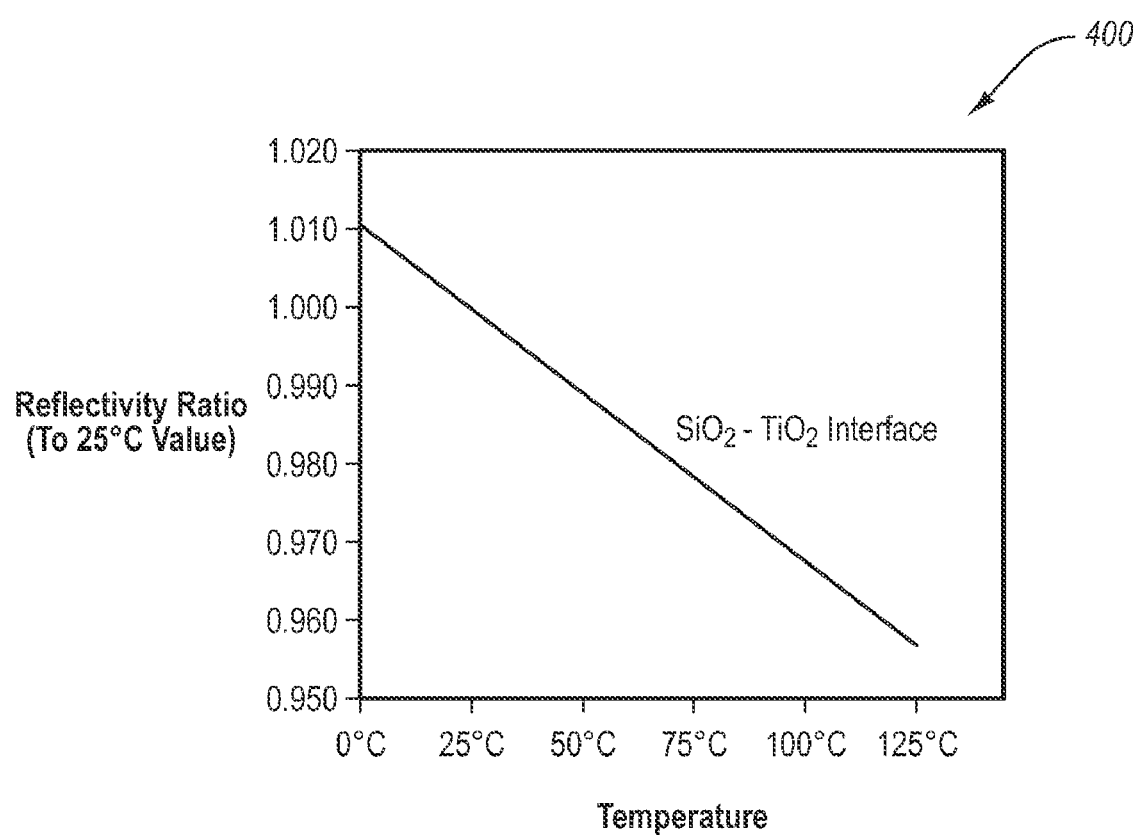
FIG. 4 illustrates a reflectivity ratio versus temperature plot of a $SiO_2$—$TiO_2$ mirror period.

In one embodiment, the layers 141b and 142b of the top mirror 126 may include dielectric materials for obtaining decreasing index contrast ratio as temperatures increase. In one embodiment, $TiO_2$ in combination with other appropriate mirror layers can produce a decreasing contrast ratio with increasing temperature. Examples of suitable optical dielectric materials that can be used include $MgF_2$, $SiO_2$, $Al_2O_3$, SiO, $Si_3N_4$, $ZrO_2$, $HfO_2$, and Si, listed in order of increasing refractive index. For example, in one embodiment, the first layer 141b may include $SiO_2$ and the second layer 142b may include $TiO_2$. The negative coefficients observed in $TiO_2$ layers produce a decreasing reflectivity as the temperature increases. FIG. 4 provides a plot 400 for demonstrating the rate at which the reflectivity ratio decreases as temperature increases using mirror pairs of $TiO_2$ and $SiO_2$.

The benefits of properly selecting the compositions of the mirror layers in the top and/or bottom mirror layers to achieve a stable slope efficiency can depend on the operating wavelength of the VCSEL. In one embodiment, the VCSEL is designed to emit light in a range from about 600 nm to about 1100 nm. Alternatively, the VCSEL is designed to emit light in a range from about 700 nm to about 900 nm, or 950 nm to about 1100 nm. In a preferred embodiment, the VCSEL emits light in the foregoing ranges and includes a top mirror with a mirror layer that includes $TiO_2$.

The present invention also includes embodiments where the contrast ratio of the upper mirror pairs is increasing with increasing temperature but to a lesser extent than the increase in contrast ratio of the bottom mirror. In this embodiment, the materials used to make the upper mirror pairs and the lower mirror pairs can be any suitable material known in the art, including dielectric materials and semiconductor materials. Examples of semiconductor materials that can be used include type IV, III-V, and II-VI materials. In one embodiment the semiconductor material includes aluminum where the aluminum concentration is varied to achieve a difference in index of refraction between two mirror layers. Other optical dielectric materials that may be used, listed in approximate order of increasing refractive index, include $MgF_2$, $SiO_2$, $Al_2O_3$, SiO, $Si_3N_4$, $ZrO_2$, $HfO_2$, $TiO_2$, and Si. Any appropriate pairs of these could be used for dielectric mirrors, with greater or lesser index ratio. In general, a larger refractive index contrast can be obtained when using dielectric materials than when using semiconductor materials. For example, if the mirror periods consist of AlGaAs semiconductor layers, alternating between 0% and 100% Aluminum, a refractive index ratio of 1.3 to 1 can be obtained. However, if the layers alternate between dielectrics $SiO_2$ and $TiO_2$, a refractive index ratio of 2 to 1 can be obtained.

In one embodiment, the composition of the mirror pairs is selected such that, with increasing temperature, the increase in the contrast ratio of the first and second bottom-mirror layers is sufficiently greater than an increase in contrast ratio of the upper-mirror layers such that the reflectivity of the top mirror increases to a lesser extent than an increase in reflectivity of the bottom mirror with increasing temperature over the desired operating temperature range.

In one embodiment of the invention, the bottom mirror and/or the top mirror are made from an $Al_xGa_{x-1}As$ system where the mirror pairs are made to have high and low index of refraction by changing the aluminum content of the mirror layers. In one embodiment the high index of refraction material has an aluminum fraction in a range from about 0 atomic % to about 25 atomic % and the low index of refraction material has an aluminum content in a range from about 75 atomic % to about 100 atomic %.

Generally, the aluminum content of an $Al_xGa_{x-1}As$ system will depend on the desired operating wavelength of the VCSEL, the proximity of the particular mirror layers to the active region, and whether the particular layer is in the upper mirror or bottom mirror. For example, for an operating wavelength in a range from about 800 nm to about 870 nm, the aluminum content of the high index of refraction layer in the bottom mirror can be made to have an aluminum content in a range from about 12% to about 25%. To achieve a desired increase in contrast ratio with increasing temperature it can be advantageous to make the aluminum content greater than about 15%, more preferably greater than 16%. Aluminum content greater than 16% in the bottom mirror has a surprisingly beneficial effect on stabilizing slope efficiency compared to the loss of thermal and electrical conductivity caused by increased aluminum.

In an alternative embodiment, the operating wavelength of the VCSEL is in a range from 950 nm to 1100 nm and the aluminum content in the high index of refraction layer of the bottom mirror is in a range from about 0.0 atomic % to about 15 atomic %. To achieve a desired increase in contrast ratio with increasing temperature it can be advantageous to make the aluminum content of the high index layer of the bottom mirror with greater than about 5 atomic % Al, more preferably greater than about 10 atomic %. These amounts of aluminum provide a surprising and unexpected stabilization of the slope efficiency in comparison to the loss of thermal and electrical conduction.

Figure 5:
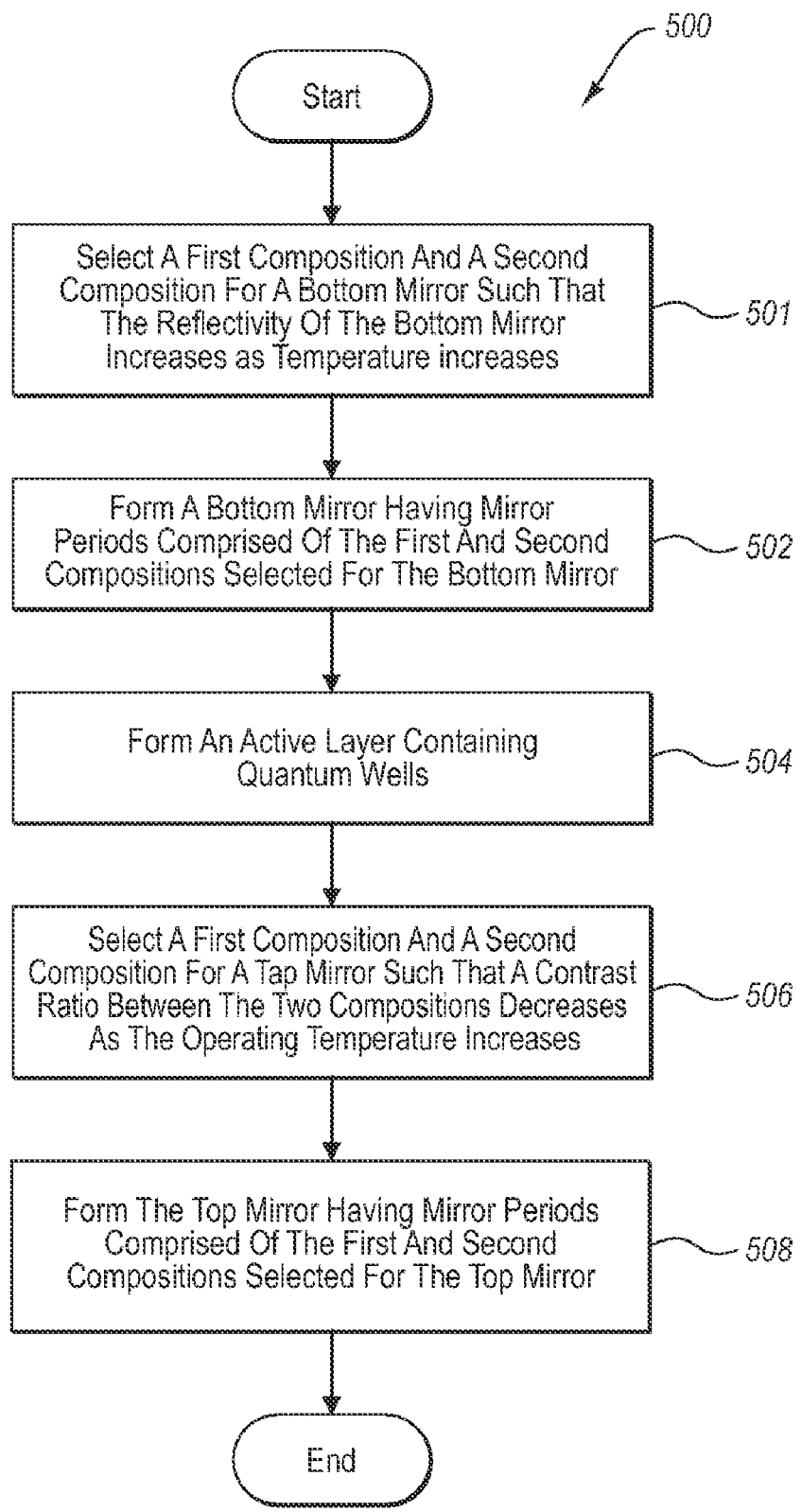
FIGS. 5, 6 and 7 illustrate examples of methods for fabricating a VCSEL according to the present invention.

Referring now to FIG. 5, one example method 500 of fabricating a VCSEL is illustrated for minimizing slope efficiency fluctuation as a result of temperature change. In one embodiment, the example method 500 may be used for fabricating a VCSEL using dielectric mirrors, although the method may also be applicable when using semiconductor materials. The example method 500 includes, at 501, selecting a first composition and a second composition for a bottom mirror such that the reflectivity of the bottom mirror increases as the operating temperature increases. This step is an optional step that may result in improved performance, including improving slope efficiency over temperature. The method 500 also includes, at 502, forming a bottom mirror on a substrate, the bottom mirror including mirror periods comprising a first layer of the first composition and a second layer of the second composition selected for the bottom layer. The method 500 also includes, at 504, forming an active region that contains quantum wells on the bottom mirror.

At 506, the method 500 also includes selecting a first composition having a high refractive index and a second composition having a low refractive index for the top mirror. The first and second compositions are selected such that a contrast ratio between the high refractive index and the low refractive index decreases as the operating temperature increases within the predetermined temperature range.

The method 500 further includes, at 508, forming a top mirror on the active region, the top layer having mirror periods comprised of a first layer of the first composition and second layer of the second composition. Due to the selection of the first and second compositions for the top and bottom mirrors in steps 501 and 506, the transmission of the top mirror remains constant or increases as the operating temperature increases.

In one embodiment, a semiconductor material is used for the first and/or second compositions within the top mirror. In another embodiment, a dielectric material is used for the first and/or second compositions within the top mirror. For example, as described previously, the first composition may include SiO$_2$, and the second composition may include TiO$_2$. In yet another embodiment, the top mirror may be comprised of both semiconductor materials and dielectric materials.

In addition to selecting the first and second compositions used in the top mirror such that the refractive index contrast ratio decreases as the operating temperature increases, in one embodiment, the first and second compositions are further selected for minimizing an increase in absorption in the top and/or bottom mirrors as the operating temperature increases within the predetermined temperature range. In one embodiment, absorption losses can be kept to a minimum by selecting compositions with bandgap energy substantially above the lasing wavelength.

Figure 6:
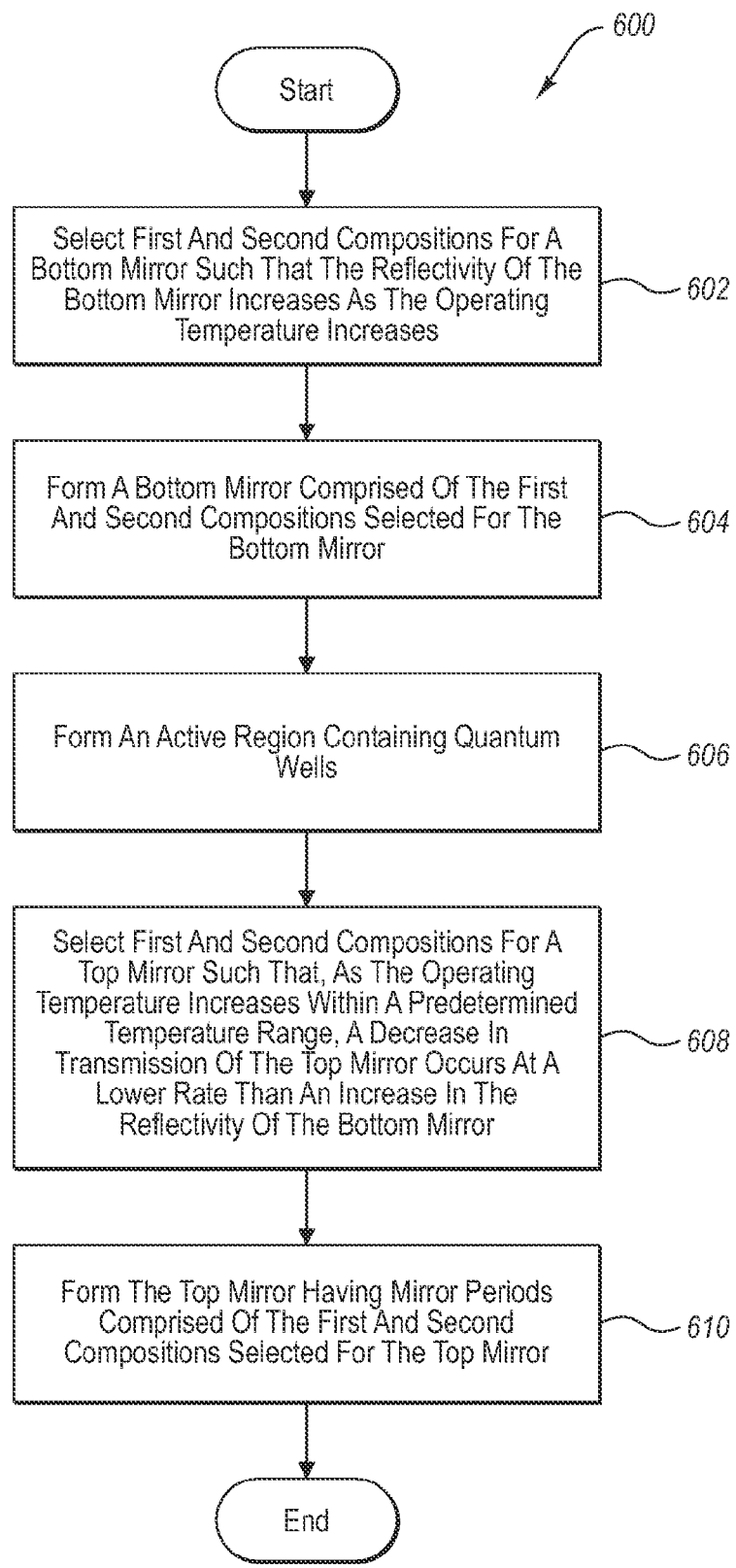

FIG. 6 illustrates an additional method 600 for fabricating a VCSEL for minimizing slope efficiency fluctuation as a result of temperature change. In one embodiment, the example method 600 may be used for fabricating a VCSEL using dielectric mirrors, although the method may also be applicable when using semiconductor materials. The example method 600 includes, at 602, selecting a first composition and a second composition for a bottom mirror such that, as an operating temperature increases within the predetermined temperature range, the reflectivity of the bottom mirror increases. The method 600 further includes, at 604, forming the bottom mirror on a substrate wherein forming the bottom mirror comprises forming mirror periods, each mirror period comprising a alternating layers of the first and second compositions selected for the bottom mirror, where the first and second layers have different indices of refraction. The method 600 also includes, at 606, forming an active region that contains quantum wells on the bottom mirror.

At 608, the method 600 further includes selecting a first composition having a high refractive index and a second composition having a low refractive index, the first and second compositions selected such that, as the operating temperature increases within a predetermined temperature range, any decrease in transmission of the top mirror occurs at a lower rate than an increase in the reflectivity of the bottom mirror. The selection of the compositions for the top and bottom layers in steps 602 and 608 may be performed in conjunction with one another to obtain the stated objective, i.e., the reflectivity of the bottom mirror increases at a higher rate than any decrease in the transmission of the top mirror as temperature increases.

Finally, at 610, the method 600 further includes forming the top mirror on the active region. Forming the top mirror includes forming mirror periods, where each mirror period includes a first layer of the first composition and second layer of the second composition selected for the top layer. The selection of the first and second compositions for the top and/or bottom mirrors reduces fluctuation of a slope efficiency of the VCSEL as the operating temperature changes within the predetermined temperature range.

Referring again to FIG. 1, in addition to selecting top mirror 126 and/or bottom mirror 116 compositions for improving slope efficiency over temperature, the present invention further minimizes the change in slope efficiency with temperature through the selection of appropriate numbers of mirror periods 143a on the bottom mirror 116. As described previously, slope efficiency will decrease (i.e., become worse) if the reflectivity of the bottom mirror 116 increases less than the reflectivity of the top mirror 126. General industry practice has been to use bottom mirror periods 143a in excess of the number that would provide the best slope efficiency temperature coefficient consistent with other performance constraints. Consequently, the reflectivity of the bottom mirror 116 is nearly at its maximum possible value when operating at room temperature, i.e., the reflectivity of the bottom mirror 116 cannot be increased by adding additional mirror periods due to the offsetting effects of absorption. However, because the bottom mirror 116 is nearly at its maximum possible value when operating at room temperature, its reflectivity cannot increase as the operating temperature increases. As noted previously, the necessarily partly transparent top mirror 126 may likely increase in absorption and/or reflectivity as temperatures increase, thereby causing slope efficiency of the VCSEL 100 to decrease.

In accordance with the present invention, the bottom mirror 116 of the VCSEL 100 is constructed using fewer mirror periods 143a than the number of mirror periods required to achieve substantially maximum reflectivity at a reference temperature (e.g., room temperature). By using a reduced number of mirror periods 143a, the reflectivity of the bottom mirror 116 is not at a maximum when operating at room temperature. As the operating temperature increases, the reflectivity of the bottom mirror 116 is able to increase at a rate that can be determined by the number of mirror periods 143a used, as well as the materials used in the mirror layers 142a and 141a. Therefore, the rate at which reflectivity of the bottom mirror 116 increases with temperature can be controlled so as to minimize slope efficiency fluctuation.

By reducing the number of mirror periods 143a below the number used to achieve maximum reflection at room temperature, the bottom mirror 116 will necessarily have some transparency when operating at room temperature, thereby producing somewhat less gain at room temperature. However, the disadvantage of reduced gain at room temperature is more than offset by having improved slope efficiency over the operating temperature range.

Figure 7:
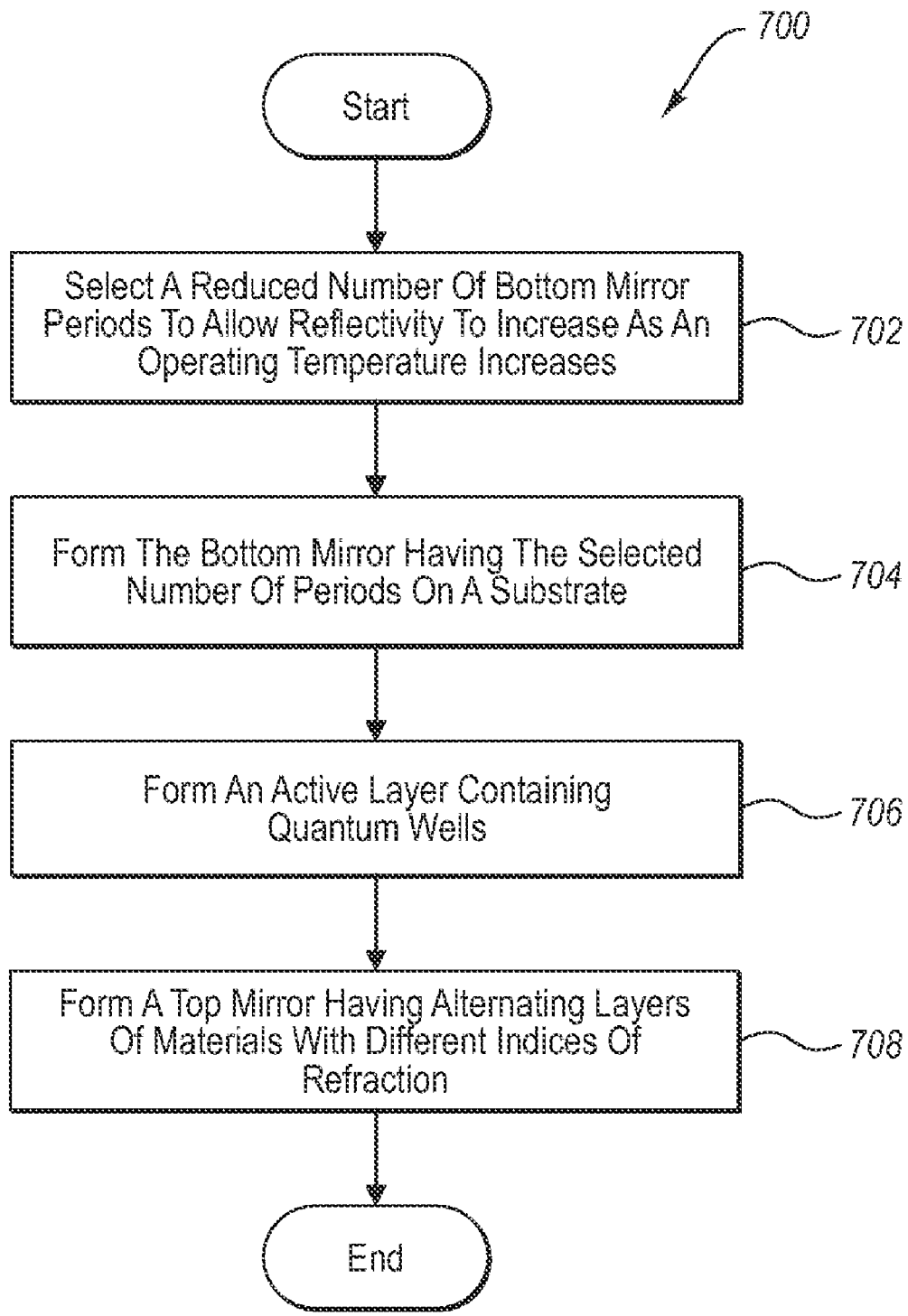

Referring now to FIG. 7, a method 700 of fabricating a VCSEL is illustrated using a reduced number of lower mirror periods. The method 700 includes, at 702, selecting a number of mirror periods for a bottom mirror that is less than the number of mirror periods required to achieve substantially maximum reflectivity at a reference temperature. As described above, a reduced number of bottom mirror periods allows the reflectivity of the bottom mirror to increase as an operating temperature increases within a predetermined temperature range. The reference temperature may be a predicted room temperature wherein the VCSEL will normally operate.

The method 700 further includes, at 704, forming the bottom mirror having the selected number of mirror periods on a substrate. Referring again to FIG. 1, the bottom mirror includes alternating layers 141a and 142a of materials with different indices of refraction. At 706, the method 700 also forms an active region that contains quantum wells on the bottom mirror.

The method 700 also includes, at 708, forming a top mirror on the active region, the top mirror also including alternating layers of materials with different indices of refraction. By controlling the number of mirror periods in the bottom mirror, as well as the composition of the top mirror, the rate at which the reflectivity of the top and bottom mirrors increase with temperature can be controlled such that the slope efficiency of the VCSEL has reduced fluctuation as the operating temperature changes within the predetermined temperature range.

In one embodiment, the slope efficiency can be minimized using a combination of techniques. For example, the techniques of (i) properly selecting the composition of the mirror pair layers to yield a desired increasing contrast ratio or (ii) reducing the number of mirror pairs in the bottom mirror, can be performed alone or in combination.

Figure 8A:
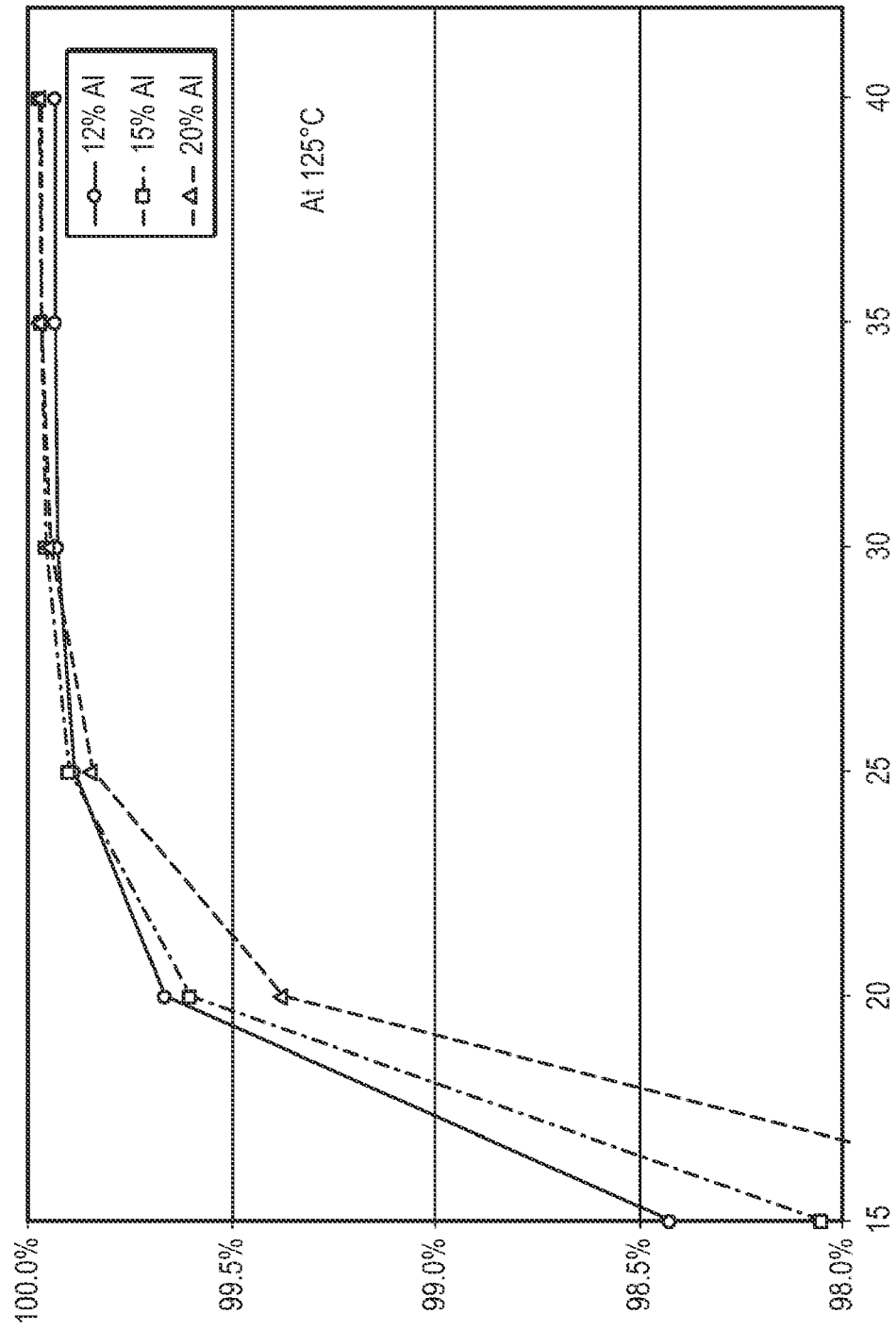
FIGS. 8A, 8B, 9A, and 9B, illustrate a simulation of mirror reflectivity as a function of the number of mirror periods for several VCSELs according to the present invention.
Figure 8B:
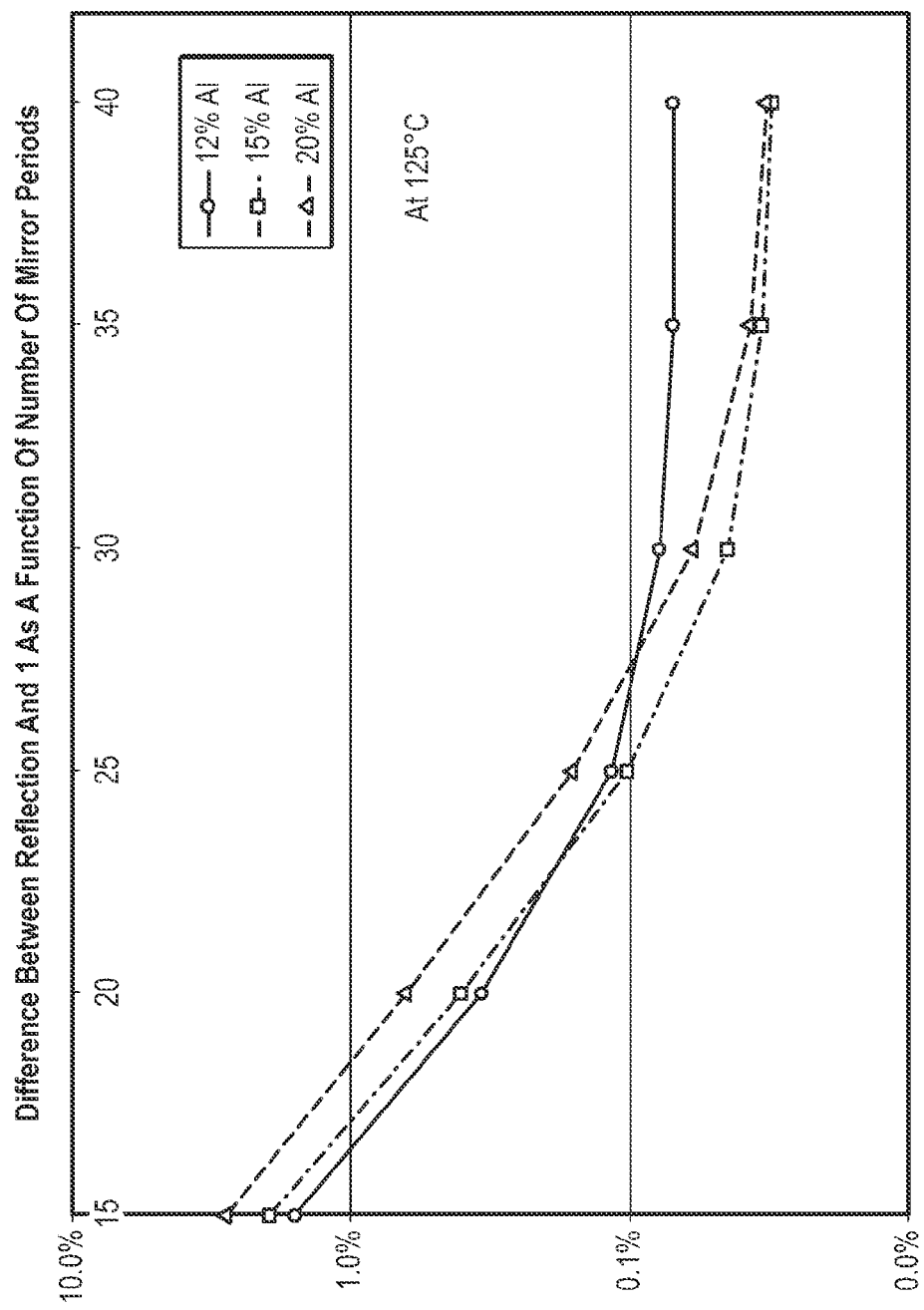
Figure 9A:
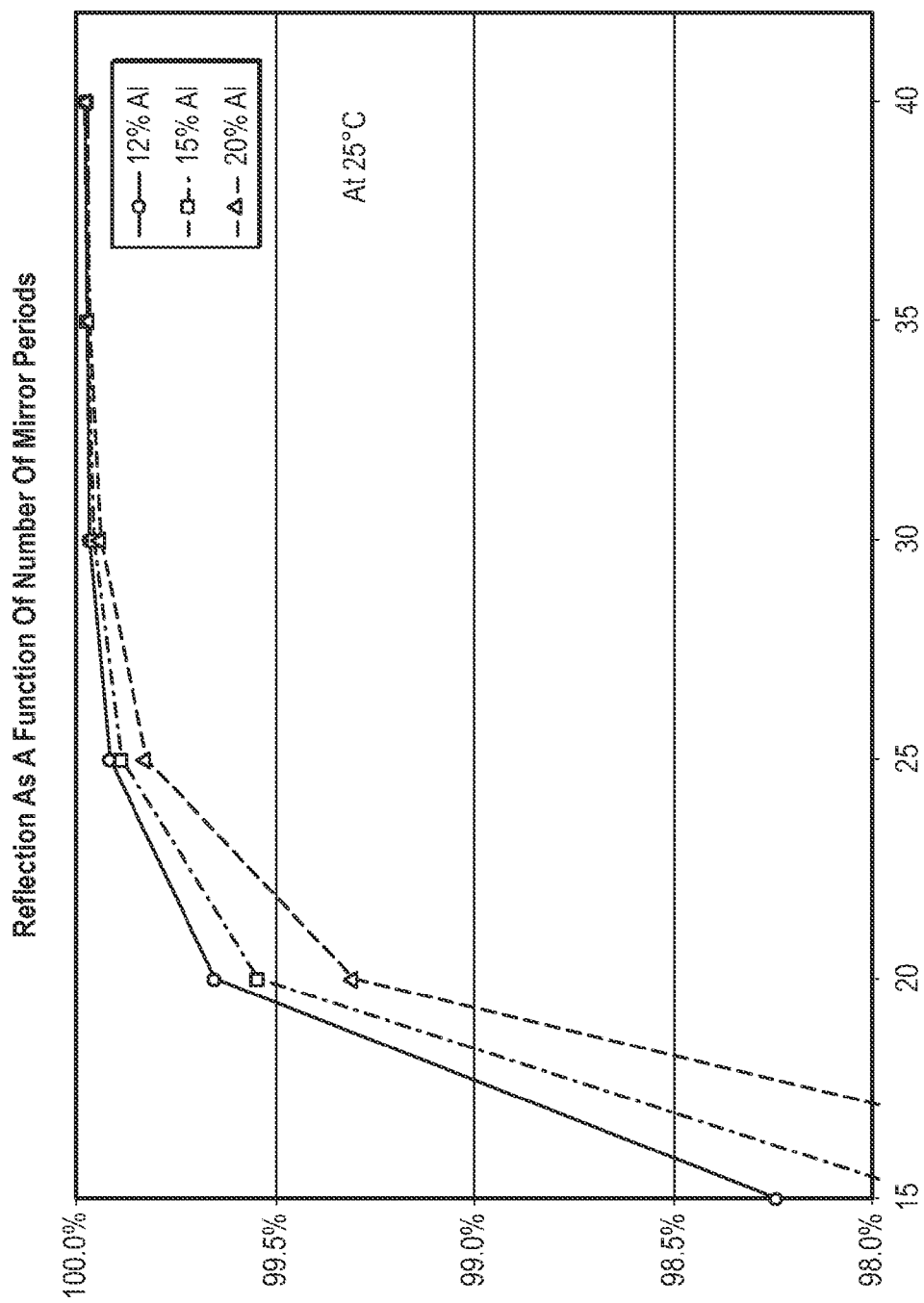
Figure 9B:
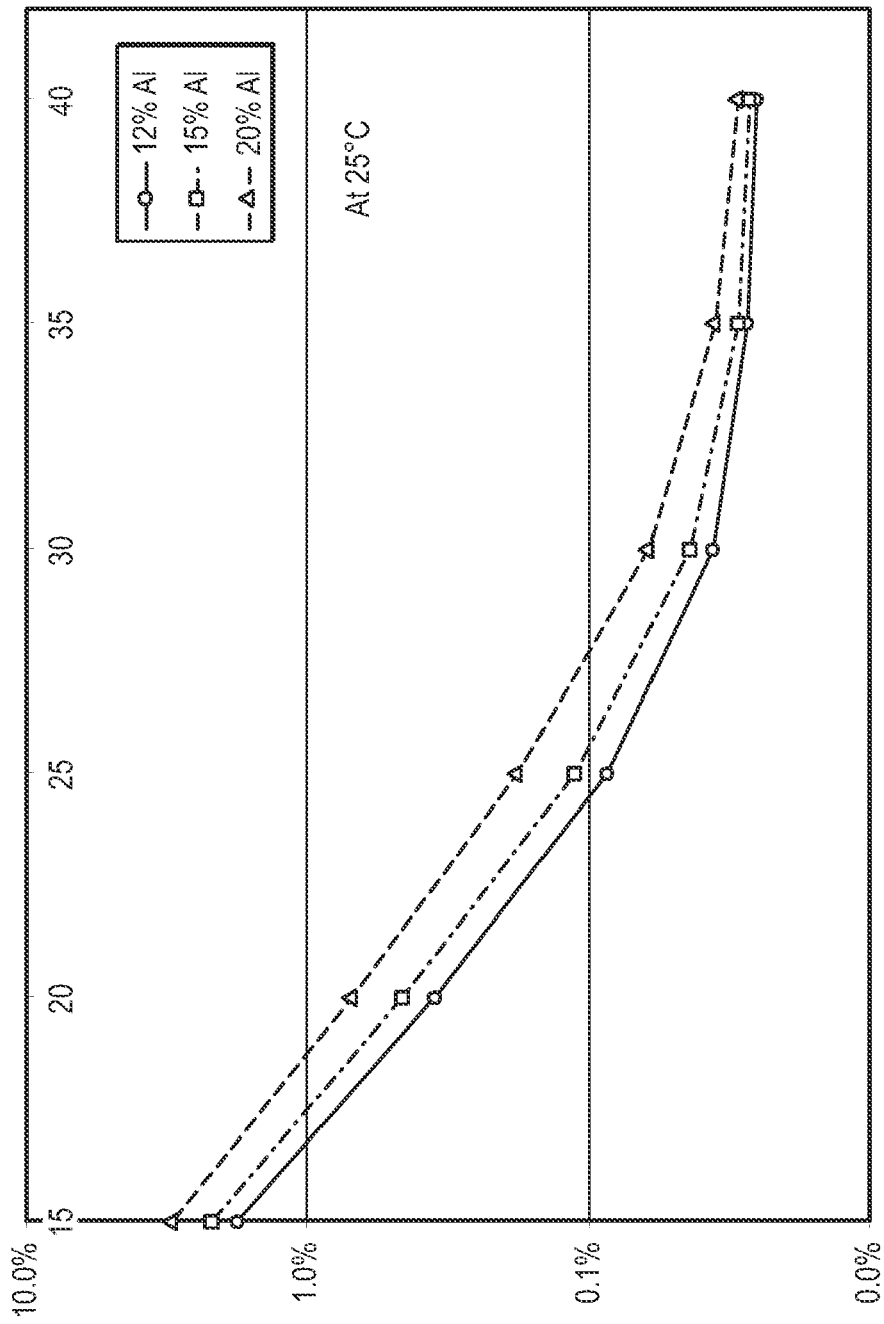
Figure 10:
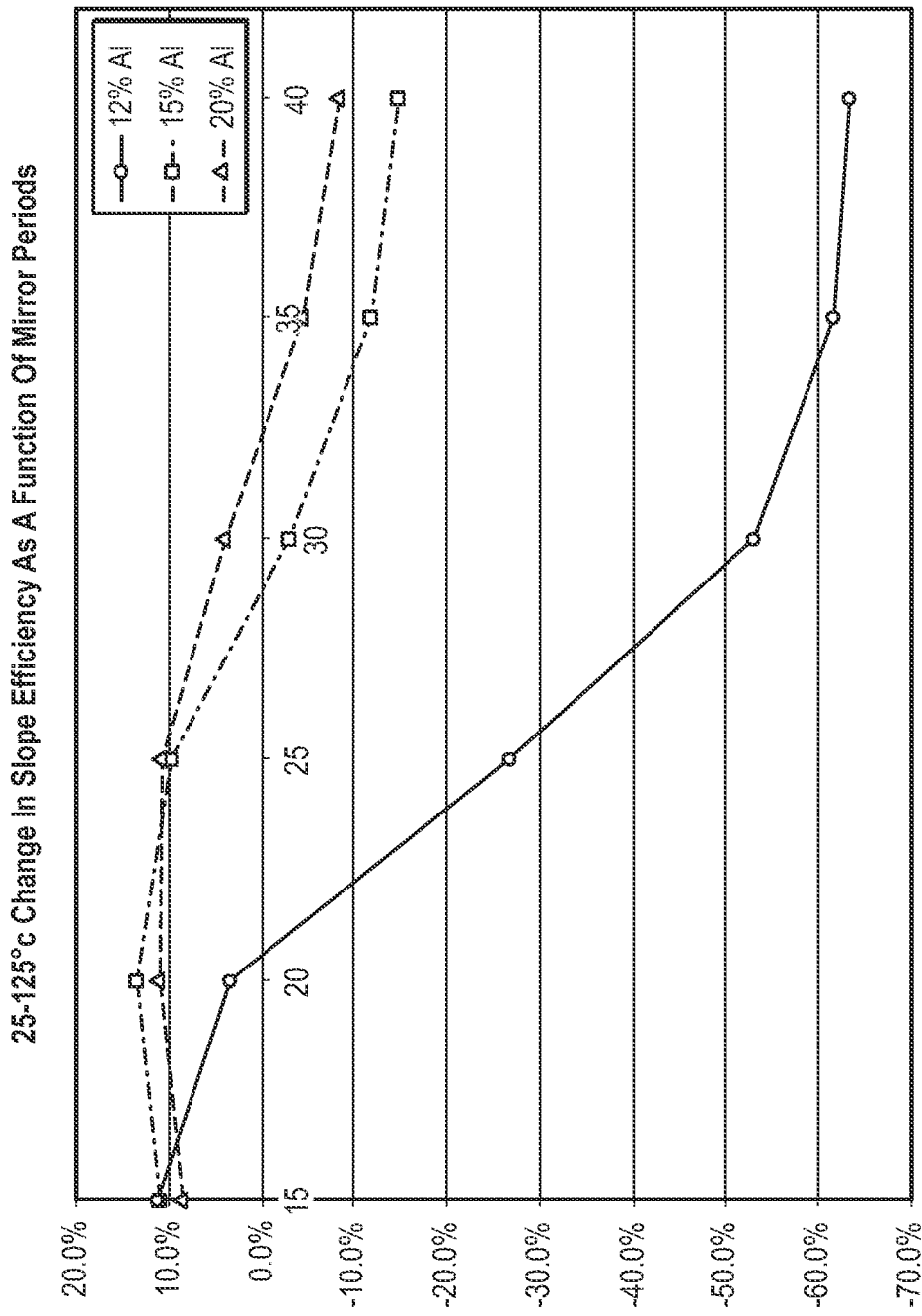
FIG. 10 illustrates the change in slope efficiency for the simulations of FIGS. 8A and 8B as a function of the number of mirror periods.

FIGS. 8-10 illustrate the optimization of slope efficiency that can be achieved by reducing the number of mirror periods, either alone or in combination with selection of the composition of the bottom mirror layers. FIGS. 8-10 show a simulation of the reflectance of three different VCSELs that are configured to emit light at 850 nm and include a top mirror and a bottom mirror made from $Al_xGa_{1-x}As$, where X is 12%, 15%, or 20%, respectively. FIG. 8A shows the reflectance at 125° C. for a given number of mirror pairs. As seen in FIG. 8A, the maximum possible reflectance is limited. The limitation in reflectance is due to absorption of photons in the mirror material. Any increase of reflectance by adding more mirror periods is offset by increased absorption. FIG. 8B provides the difference between the reflection and 1 as a function of the number of mirror periods. FIGS. 9A and 9B are similar simulations to those in 8A and 8B, respectively, except that the simulation is for a temperature of 25° C.

FIG. 10 shows the change in slope efficiency from 25° C. to 125° C. as a function of the number of mirror periods for the simulations illustrated in FIGS. 8A and 9A. The change in slope efficiency illustrated in FIG. 10 is the component of the slope efficiency contributed by the bottom mirror and assumes all other factors are held constant. As shown in the simulation, composition of the high index material in the bottom mirror can be selected in combination with a selection of the number of mirror periods to achieve a desired slope efficiency. For example, where a positive slope efficiency is desired for a VCSEL operating between 700 nm and 870 nm, an aluminum content of 20 atomic % and fewer than 32 mirror periods can be selected. In one embodiment, the composition of the high and low index of refraction layers of the bottom mirror adjacent the active region are selected so as to give the mirror layers at least about 5% more positive change in slope efficiency with increasing temperature compared to the same device having a 15% aluminum content in the high index material and 85% aluminum in the low index layer of the bottom mirror. More preferably the change is at least 10% more positive.

In an alternative embodiment, the VCSEL has an operating wavelength between 900 and 1100 and the composition of the high index and low index layers of the bottom mirror adjacent the active region are selected to have at least 5% more positive change in slope efficiency with increasing temperature compared to the same device having a 0% aluminum content in the high index material and 85% aluminum in the low index material. More preferably the change is at least 10% more positive. Surprisingly, the rate of change of slope efficiency with temperature can be reduced by 0.1%/° C. or more (from a typical starting value near 0.55/° C.) by slightly reducing the number of mirror pairs that would give the optimum reflectivity, particularly when done in combination with an adjustment to the contrast ratio of the mirror periods. In one embodiment, the number of mirror periods is reduced by at least about 2 mirror periods, more preferably at least 3 mirror periods, and most preferably at least 5 mirror periods from an optimal number of mirror periods. For purposes of this invention, an optimal number of mirror periods is the fewest mirror periods that is within 0.1% reflectivity of the maximum possible reflectivity.

As shown in a comparison of FIGS. 8A, 8B, and 10 illustrates that a suitable slope efficiency can be achieved with a suitable reflectivity by making slight adjustments to the composition and/or the number of mirror pairs.

In addition, the foregoing techniques can be performed in combination with a third technique, which provides a non-optimized bottom mirror at room temperature by designing the bottom mirror to have a maximum reflectivity at a wavelength that is greater than the wavelength produced by the VCSEL at room temperature. The maximum reflectivity of the VCSEL becomes more closely matched to output wavelength of the VCSEL as temperature increases over the desired operating temperature range.

Using the principles disclosed herein, VCSELs can be constructed having slope efficiency temperature coefficients at or near to zero. Minimizing slope efficiency fluctuation significantly simplifies systems using VCSELs because compensation schemes are no longer needed.

As described previously, the present invention utilizes the described techniques to reduce the negative impact that an increase in temperature may have on the slope efficiency of a VCSEL. To further moderate the effects of temperature, compounds may be used to improve heat removal of heat from the device to maximize the peak power and enhance reliability. The aspects of the epitaxial structure which facilitate this are the extensive use of highly thermally conductive binary compounds close to the quantum wells 144. Extensive use of GaAs can be made adjacent to the quantum wells 144, and in both mirrors 116, 126. In addition, the lower mirror 116 can make extensive use of AlAs which has better thermal conductivity than GaAs.

High temperature performance is limited by a combination of effects. At high temperatures confinement of carriers to the quantum wells 144 becomes marginal. This of course is helped by good thermal design to remove heat, and minimizing series resistance to avoid excess heat generation. In addition, the depth of the quantum wells 144 is important to reduce carrier leakage past the quantum wells. In addition, doping spikes, and extra AlGaAs confining layers can be used to enhance confinement.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A vertical cavity surface emitting laser (VCSEL), comprising:

a bottom mirror above a substrate, the bottom mirror comprising a plurality of lower mirror pairs, each lower mirror pair comprised of a first bottom-mirror layer and a second bottom-mirror layer, the first and second bottom-mirror layers having different indices of refraction, wherein the first and second bottom-mirror layers have a contrast ratio that increases with increasing temperature over a desired operating temperature range;

an active region above the bottom mirror, the active region comprising a plurality of quantum wells; and an upper mirror above the active region, the upper mirror comprising a plurality of upper mirror pairs, each upper mirror pair comprised of a first upper-mirror layer and a second upper-mirror layer, the first and second upper-mirror layers having different indices of refraction, wherein, with increasing temperature over the desired operating temperature range, the contrast ratio of the first and second upper-mirror layers either (i) decreases or (ii) increases to a lesser extent than the contrast ratio of the first and second bottom-mirror layers, thereby reducing fluctuation of a slope efficiency of the VCSEL; and wherein the VCSEL has an operating wavelength in a range from about 600 nm to about 870 nm and the bottom mirror comprises an $Al_xGa_{x-1}As$ system, the first bottom-mirror layer having an aluminum content in a range from about 16 atomic % to about 25 atomic % and the second bottom-mirror layer having an aluminum content in a range from about 70 atomic % to about 100 atomic %.

2. A VCSEL as in claim 1, wherein the increase in the contrast ratio of the first and second bottom-mirror layers is sufficiently greater than an increase in contrast ratio of the upper-mirror layers such that the reflectivity of the top mirror increases to a lesser extent than an increase in reflectivity of the bottom mirror with increasing temperature over the desired operating temperature range.

3. A VCSEL as in claim 1, wherein the first and second upper-mirror layers have a decreasing contrast ratio with increasing temperature.

4. A VCSEL as in claim 3, wherein the first upper mirror layer comprises $TiO_2$.

5. A VCSEL as in claim 1, wherein the desired operating temperature range is from about 0° C. to about 70° C.

6. A VCSEL as in claim 1, wherein the desired operating temperature range is from about −40° C. to about 85° C.

7. A VCSEL as in claim 1, wherein the desired operating temperature range is from about 0.0° C. to about 125° C.

8. A VCSEL as in claim 1, wherein the plurality of bottom mirror pairs each have a non-optimized thickness that is less than a thickness that gives maximum possible reflectance at a desired operating temperature such that, as the operating temperature of the VCSEL increases to the desired operating temperature, the reflectance of the bottom mirror increases in reflectivity.

9. A VCSEL as in claim 1, wherein the bottom mirror has fewer mirror periods than the number of mirror periods that gives the maximum possible reflectivity.

10. A VCSEL as in claim 9, wherein the reflectivity of the mirror is less than 99.7%.

11. A method of fabricating a VCSEL comprising:
(a) identifying,
   (i) a first composition for forming a first bottom-mirror layer;
   (ii) a second composition for forming a second bottom-mirror layer, the second composition having a different index of refraction than the first composition;
   (iii) a third composition for forming a first top-mirror layer; and
   (iv) a fourth composition for forming a second top-mirror layer, the fourth composition having a different index of refraction than the third composition;
   wherein a contrast ratio between the first and second compositions is identified as increasing more with increasing temperature compared to a contrast ratio between the third and fourth compositions, the compositions therefore being identified as compositions that reduce fluctuations in slope efficiency of the VCSEL;
(b) forming a bottom mirror having a plurality of alternating first and second bottom-mirror layers comprised of the first and second compositions, respectively;
(c) forming an active region above the bottom mirror, the active region comprising a plurality of quantum wells; and
(d) forming a top mirror having a plurality of alternating first and second top-mirror layers comprised of the third and fourth compositions, respectively to yield a VCSEL wherein the VCSEL has an operating wavelength in a range from about 600 nm to about 870 nm and the bottom mirror comprises an $Al_xGa_{x-1}As$ system, the first bottom-mirror layer having an aluminum content in a range from about 16 atomic % to about 25 atomic % and the second bottom-mirror layer having an aluminum content in a range from about 70 atomic % to about 100 atomic %.

12. A method as in claim 11, wherein the first composition and the second composition are further selected for minimizing an increase in absorption in the top mirror as the operating temperature increases within the predetermined temperature range.

13. A vertical cavity surface emitting laser (VCSEL), comprising:
   a bottom mirror above a substrate, the bottom mirror comprising a plurality of lower mirror pairs, each lower mirror pair comprised of a first bottom-mirror layer and a second bottom-mirror layer, the first and second bottom-mirror layers having different indices of refraction, the bottom mirror having a reflectivity less than 99.8%;
   an active region above the bottom mirror, the active region comprising a plurality of quantum wells;
   an upper mirror above the active region, the upper mirror comprising a plurality of upper mirror pairs, each upper mirror pair comprised of a first upper-mirror layer and a second upper-mirror layer, the first and second upper-mirror layers having different indices of refraction; and
   wherein the lower mirror has at least 5 fewer lower-mirror pairs than an optimal number of lower-mirror pairs, the number of lower-mirror pairs being selected such that the lower mirror increases in reflectivity with increasing temperature over a desired operating temperature range from about 15° C. to about 40° C., thereby minimizing fluctuation of a slope efficiency of the VCSEL.

14. A VCSEL as in claim 13, wherein the bottom mirror has a reflectivity of less than 99.7%.

15. A VCSEL as in claim 13, wherein the plurality of bottom mirror pairs each have a non-optimized thickness that is less than a thickness that gives maximum possible reflectance at a desired operating temperature such that, as the operating temperature of the VCSEL increases to the desired operating temperature, the reflectance of the bottom mirror increases in reflectivity.

16. A vertical cavity surface emitting laser (VCSEL), comprising:
   a bottom mirror above a substrate, the bottom mirror comprising a plurality of lower mirror pairs, each lower mirror pair comprised of a first bottom-mirror layer and a second bottom-mirror layer, the first and second bottom-mirror layers having different indices of refraction, wherein the first and second bottom-mirror layers have a contrast ratio that increases with increasing temperature over a desired operating temperature range;
   an active region above the bottom mirror, the active region comprising a plurality of quantum wells; and
   an upper mirror above the active region, the upper mirror comprising a plurality of upper mirror pairs, each upper mirror pair comprised of a first upper-mirror layer and a second upper-mirror layer, the first and second upper-mirror layers having different indices of refraction,
   wherein, with increasing temperature over the desired operating temperature range, the contrast ratio of the first and second upper-mirror layers either (i) decreases or (ii) increases to a lesser extent than the contrast ratio of the first and second bottom-mirror layers, thereby reducing fluctuation of a slope efficiency of the VCSEL; and
   wherein the VCSEL has an operating wavelength in a range from about 900 nm to about 1100 nm and the bottom mirror comprises an $Al_xGa_{x-1}As$ system, the first bottom-mirror layer having an aluminum content in a range from about 5 atomic % to about 15 atomic % and the second bottom-mirror layer has an aluminum content in a range from about 70 atomic % to about 100 atomic %.

17. A VCSEL as in claim 16, wherein the increase in the contrast ratio of the first and second bottom-mirror layers is sufficiently greater than an increase in contrast ratio of the upper-mirror layers such that the reflectivity of the top mirror increases to a lesser extent than an increase in reflectivity of the bottom mirror with increasing temperature over the desired operating temperature range.

18. A VCSEL as in claim 16, wherein the first and second upper-mirror layers have a decreasing contrast ratio with increasing temperature.

19. A VCSEL as in claim 16, wherein the desired operating temperature range is from about 0° C. to about 70° C.

20. A VCSEL as in claim 16, wherein the plurality of bottom mirror pairs each have a non-optimized thickness that is less than a thickness that gives maximum possible reflectance at a desired operating temperature such that, as the operating temperature of the VCSEL increases to the desired operating temperature, the reflectance of the bottom mirror increases in reflectivity.

21. A VCSEL as in claim 16, wherein the bottom mirror has fewer mirror periods than the number of mirror periods that gives the maximum possible reflectivity.

22. A VCSEL as in claim 21, wherein the reflectivity of the mirror is less than 99.7%.

23. A vertical cavity surface emitting laser (VCSEL), comprising:
  a bottom mirror above a substrate, the bottom mirror comprising a plurality of lower mirror pairs, each lower mirror pair comprised of a first bottom-mirror layer and a second bottom-mirror layer, the first and second bottom-mirror layers having different indices of refraction, wherein the first and second bottom-mirror layers have a contrast ratio that increases with increasing temperature over a desired operating temperature range;
  an active region above the bottom mirror, the active region comprising a plurality of quantum wells; and
  an upper mirror above the active region, the upper mirror comprising a plurality of upper mirror pairs, each upper mirror pair comprised of a first upper-mirror layer comprising $TiO_2$ and a second upper-mirror layer, the first and second upper-mirror layers having different indices of refraction,
  wherein, with increasing temperature over the desired operating temperature range, the contrast ratio of the first and second upper-mirror layers decreases thereby reducing fluctuation of a slope efficiency of the VCSEL; wherein the second upper-mirror layer comprises $MgF_2$, $SiO_2$, $Al_2O_3$, SiO, $Si_3N_4$, $ZrO_2$, $HfO_2$, Si, or a combination thereof.

24. A VCSEL as in claim 23, wherein the operating wavelength of the VCSEL is in a range from about 640 nm to about 860 nm.

25. A VCSEL as in claim 23, wherein the desired operating temperature range is between −40° C. and 85° C.

* * * * *